United States Patent [19]

Hayashi et al.

[11] 4,390,788
[45] Jun. 28, 1983

[54] ELECTRON BEAM PATTERNING METHOD AND APPARATUS WITH CORRECTION OF DEFLECTION DISTORTION

[75] Inventors: Soichiro Hayashi; Yoshihiko Suenaga, both of Katsuta, Japan

[73] Assignee: Hitachi, Ltd., Tokyo, Japan

[21] Appl. No.: 239,512

[22] Filed: Mar. 2, 1981

[30] Foreign Application Priority Data

Mar. 5, 1980 [JP] Japan ............................ 55-26699

[51] Int. Cl.³ .......................................... H01J 37/00
[52] U.S. Cl. ............................ 250/491.1; 250/492.2
[58] Field of Search ............... 250/492.2, 398, 491; 219/121 EB, 121 EM

[56] References Cited

U.S. PATENT DOCUMENTS

| | | | |
|---|---|---|---|
| 3,644,700 | 2/1972 | Kruppa et al. | 250/492.2 |
| 3,900,736 | 8/1975 | Michail et al. | 250/492.2 |
| 4,119,854 | 10/1978 | Tanaka et al. | 250/492.2 |

*Primary Examiner*—Bruce C. Anderson
*Attorney, Agent, or Firm*—Antonelli, Terry & Wands

[57] ABSTRACT

An electron beam pattern is formed on an object while correcting the deflection distortion of electron beam upon controlling the deflection of electron beam. Prior to pattern formation, reference marks provided on the object are scanned by electron beam to measure their positions, and a processing unit determines correction data for correcting the deflection distortion through interpolation on the basis of results by interpolation. Upon actual pattern formation, data necessary for forming a pattern is corrected by the correction data to be thus produced as a deflection signal for deflecting the electron beam. As a result, the deflection distortion can precisely be corrected for even though the physical performance of the deflector system is slightly poor.

6 Claims, 13 Drawing Figures

ELECTRON BEAM PATTERNING METHOD AND APPARATUS WITH CORRECTION OF DEFLECTION DISTORTION

BACKGROUND OF THE INVENTION

This invention relates to the improvement of an electron beam patterning method and apparatus, and more particularly to the correction of deflection distortion.

In the electron beam patterning apparatus since the deflection distortion of the electron beam greatly affects the precision of pattern formation, some correction therefor must be made. For example, as disclosed in U.S. Pat. No. 3,900,736, actual deflecting signals for deflecting the electron beam are used which satisfy the following equations $$U_X = AX + BY + CXY + D \quad (1)$$

$$U_Y = EX + FY + GXY + H \quad (2)$$

where $U_X$ and $U_Y$ represent the actual deflection signals in the X-axis and Y-axis directions, respectively, and A to H are the correction factors. The correction factors A to H are determined as follows.

On an object or sample which is irradiated by an electron beam, there are formed a number of reference marks for permitting the electron beam to be directed to a correct position. One of the reference marks is moved to the vicinity of an area in which the deflection signal is zero or to a region where the deflection distortion is negligible (referred to as region of near zero deflection signal), the electron beam is caused to impinge upon the object, and the reflected electrons or secondary electrons are then detected. The detected output is read into a control apparatus where computation is performed to determine the position of the one reference mark.

The closest reference mark adjacent to the above one reference mark is similarly moved, by moving the object, to the region of near zero deflection signal, and detection is made thereat. The detected position and the moving distance of the object are determined and read into a control apparatus to determine the distance between the two adjacent reference marks. In this way, the distances between all the reference marks are determined as a first step.

Then, the object is moved so that the central one of the reference marks can be detected at the region of near zero deflection signal. After the movement, the remaining reference marks surrounding the central reference mark are detected by deflecting the electron beam and the positions thereof are computed by the control apparatus. This is a second step.

The difference between the positions of the reference marks which are computed at the first and second steps is the deflection the distortion caused by deflecting electron beam. In order to remove the deflection distortion, the correction factors A to H in the equations (1) and (2) are changed and then established in a deflection distortion correcting circuit. Then, the above second step is repeated several times until suitable correction factors can be determined to provide zero difference between the positions of the reference marks.

However, this method inevitably produces more or less, asymmetrical and independent distortion in each quadrant because the precision of fabrication of a deflector system such as deflector coil has a limitation. Such a distortion can not be expressed by the equations (1) and (2) and cannot be properly corrected.

SUMMARY OF THE INVENTION

It is an object of this invention to provide an electron beam patterning method and apparatus in which the deflection distortion can well be corrected even though the physical performance or fabrication precision of a deflector system is somewhat poor.

In accordance with this invention, before the electron beam is deflected to form a desired pattern on an object, the true values of the positions of a plurality of predetermined reference marks on the object and the false values thereof including errors caused by the deflection distortion of the electron beam, are measured and used to determine data for correcting the errors by interpolation. This data is stored in a memory and, upon actual pattern formation, read therefrom to correct for the distortion of deflection of the electron beam.

DESCRIPTION OF THE PREFERRED EMBODIMENT

Figure 1:
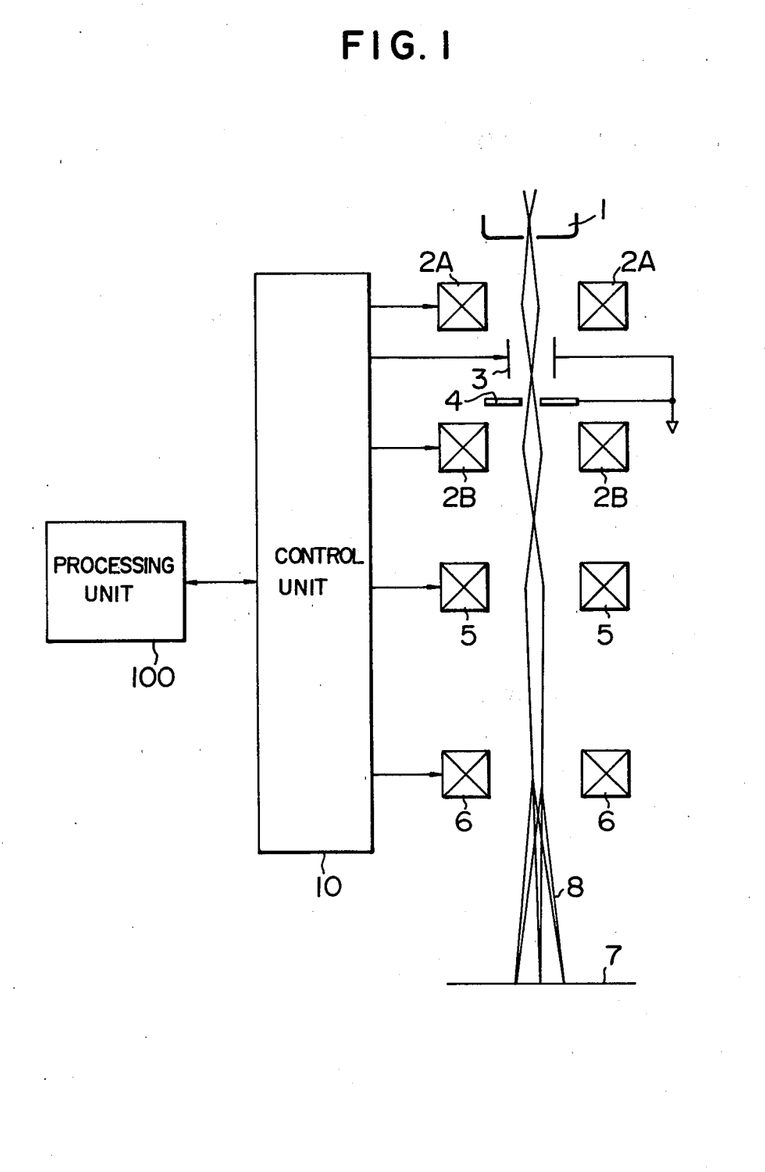
FIG. 1 shows the whole arrangement of an electron beam patterning apparatus to which this invention is applied.

An electron beam patterning apparatus to which this invention is applied will be described briefly with reference to FIG. 1. There is shown an electron gun 1 for emitting an electron beam 8 of charged particles in a well known manner. This electron beam 8 is shaped into a fine beam by a pair of condenser lenses 2A and 2B and the beam is focussed on the surface of an object or sample 7 by an objective lens 5. Also, the electron beam 8 is deflected by a deflector coil 6 in a predetermined direction on the X-Y plane of the object 7 to form or depict a desired pattern. Although the deflector coil 6 as shown in FIG. 1 is for electromagnetic deflection, electrostatic deflector plates may be used for electrostatic deflection of electron beam 8. Moreover, the electron beam 8 is affected by the change of a blanking signal at blanking plates 3 provided between the condenser lenses 2A and 2B and thereby maybe cut off by a blanking iris 4 so that the beam 8 is controlled to strike or not to strike the object 7. The condenser lenses 2A and 2B, blanking plates 3, object lens 5, and deflector coil 6 are controlled by a control unit 10 which is controlled by a processing unit 100 using an electronic computer. The processing unit 100 supplies a deflection signal and a blanking signal via the control unit 10 to the deflector coil 6 and the blanking plates 3, respectively to draw an arbitrary pattern on the object 7.

This invention is aimed to correct for the deflection distortion of the electron beam deflected by the deflector coil 6.

The construction and operation of the processing unit 100 and control unit 10 will hereinafter be described in association with the deflector coil 6.

Figure 2:
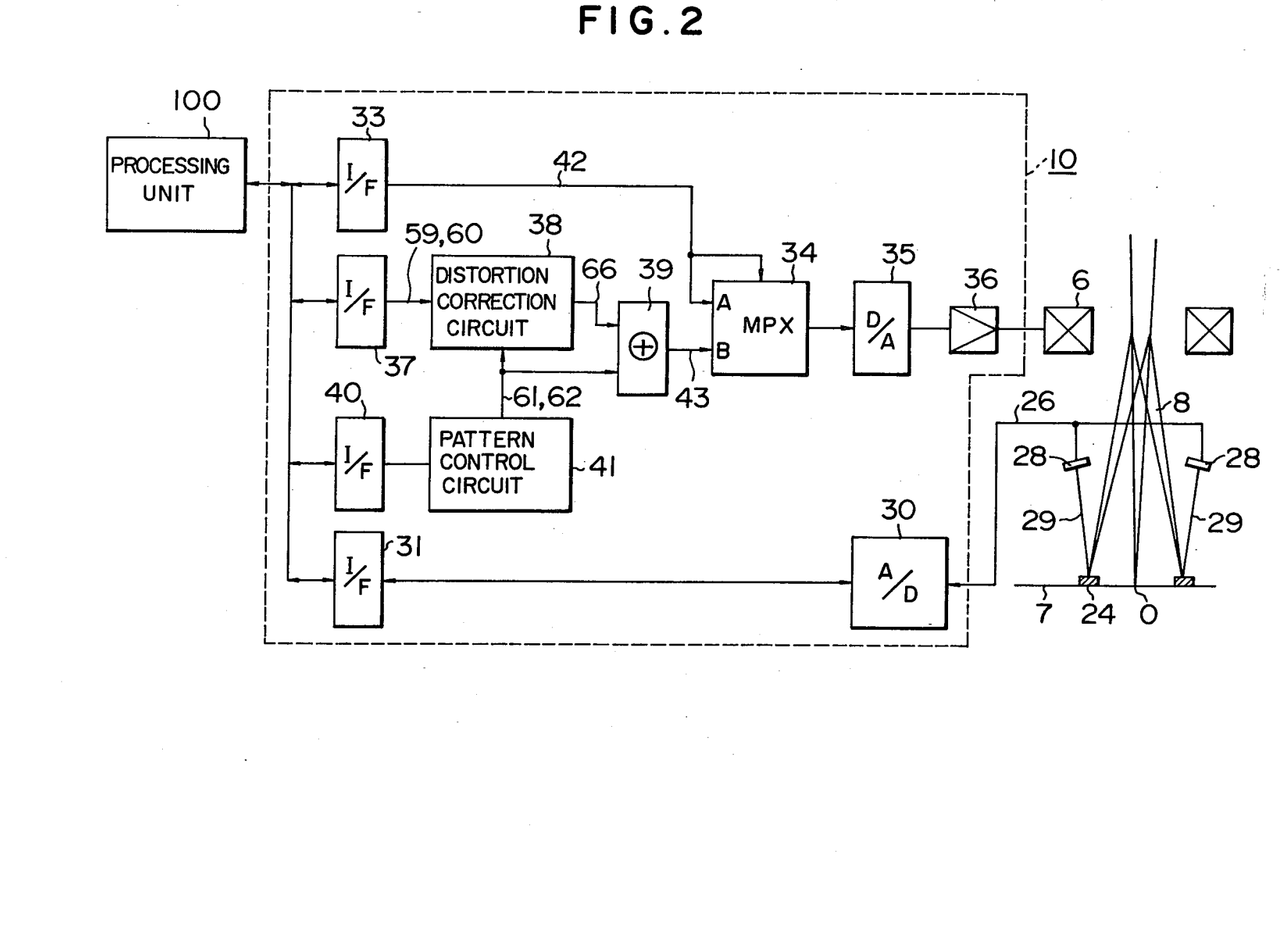
FIG. 2 is a block diagram of a deflecting system having a deflection distortion correcting function according to an embodiment of this invention.

FIG. 2 is a block diagram of a deflecting system with a deflection distortion correcting function as one embodiment of this invention. Referring to FIG. 2, there is shown the electron beam 8, which causes a deflection distortion as the amount of its deflection is increased because a uniform magnetic field is difficult to be established by the deflector coil 6 due to its low or poor mechanical precision.

In order to measure the amount of this deflection distortion, reference marks 24, which will be described later, are prepared on the object 7. When the electron beam 8 scans the reference marks 24, reflected electrons or secondary electrons 29 are emitted or produced therefrom and then detected by a detector 28. An output signal 26 from the detector 28 is converted into a digital signal by an A/D (analog to digital) converter 30 and then supplied via an interface circuit 31 to the processing unit 100. In this case, of course, where the processing unit 100 supplies a data command signal via the interface circuit 31 to the A/D converter 30, the A/D converter 30 converts the detected signal 26 to a digital signal and supplies it to the processing unit 100. The processing unit 100 determines the position of the center of the reference mark 24 from the change of the detected signal 26 with respect to the magnitude of the deflection signal which a deflection amplifier 36 supplies to the deflector coil 6.

The reference mark 24, when it is on a mask (of glass material), is usually produced by using gold suitable for a large amount of the reflected electrons 29, or when it is on a semiconductor wafer, by cutting a groove in the wafer.

Figure 3:
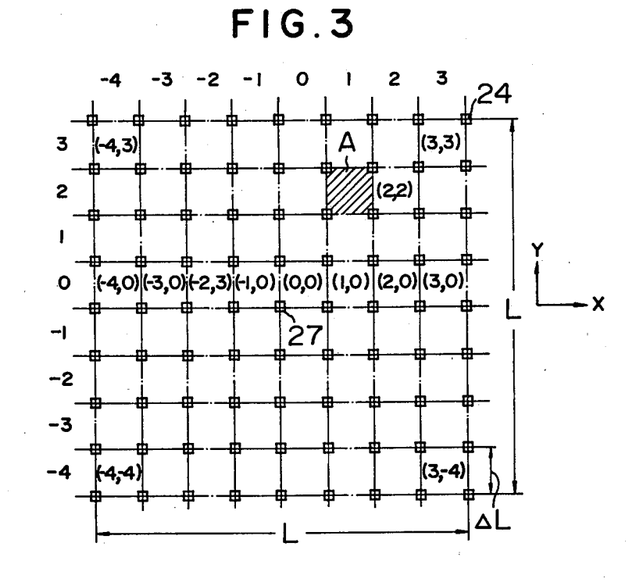
FIG. 3 shows the arrangement of the reference marks on the object.

FIG. 3 is a diagram of an object on which a number of reference marks 24 are arranged in a region where the electron beam is deflected by the deflector coil 6. L represents the maximum deflection ranges in the X- and Y-axes, and $\Delta L$ is $L/2^n$. The reason why $\Delta L = L/2^n$ is that when the deflection signal is of a digital amount, the coordinates of each reference mark can be expressed by the upper n bits of the deflection signal for each axis, permitting all the processes to be easily performed. In FIG. 3, n is selected as 3 for convenience. Therefore, the number of reference marks 24 is $(2^3+1)^2$ or 81.

All the reference marks on the object are irradiated by the electron beam 8 and the detected outputs from the detector determine the positions thereof and are used to compute the distortion correcting data.

In order to determine the coordinates of the center position of the reference mark 24 from the detection signal 26, the value of the mark detected signal with respect to the deflection position signal is converted to a digital value by the A/D converter 30 and then supplied to the processing unit 100 where the collected digital values by sequential change of the deflection position signal are processed and thereby the peak of the reference mark 24 is searched for computing the center value.

Figure 4A:
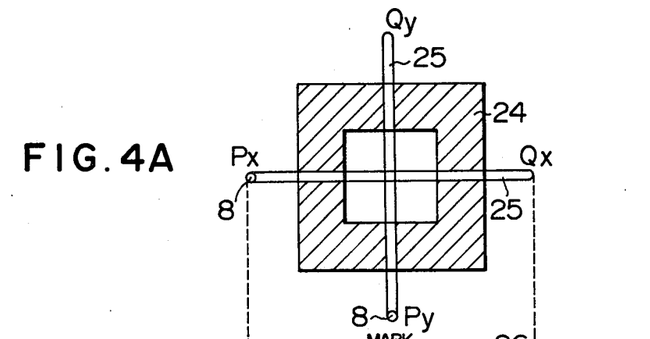
FIGS. 4A and 4B show the relation between the reference marks and the electron beam, and the mark detection signal, respectively.
Figure 4B:
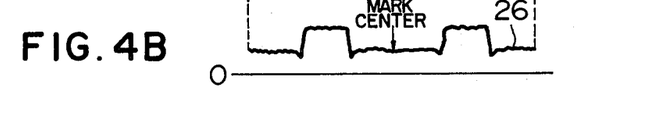

FIGS. 4A and 4B show the scanning of the electron beam 8 on one of the reference marks 24 as shown in FIG. 3, and the detected signal from the detector 28, respectively. The scanning of the electron beam 8, as shown in FIG. 4A, is performed from a start point $P_X$ to an end point $Q_X$ in the X-axis direction and from a start point $P_Y$ to an end point $Q_Y$ in the Y-axis direction. Moreover, the detected output signal 26 from the detector 28 as shown in FIG. 4B is obtained when the scanning is made in the X-axis direction.

Figure 5:
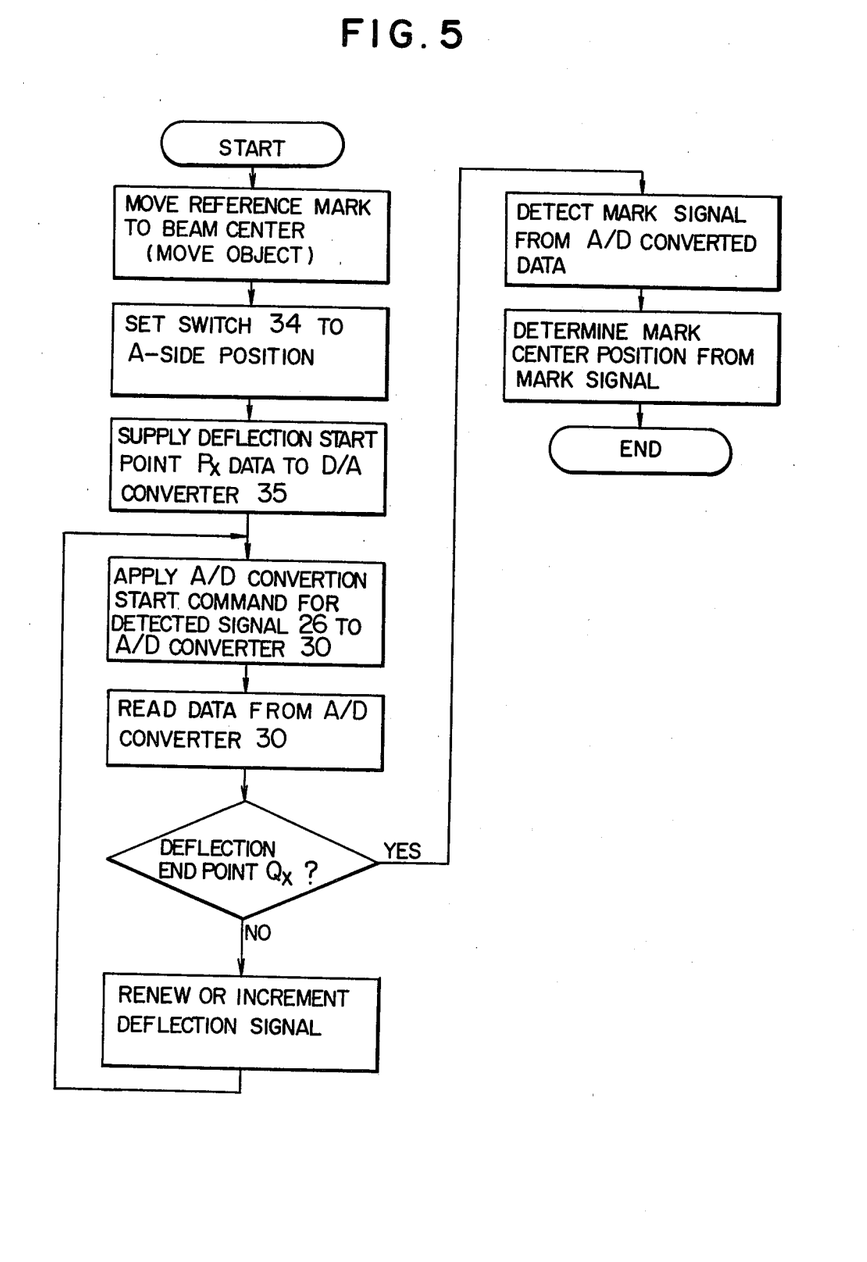
FIG. 5 is a flow chart useful for explaining the signal processing for the mark detection in FIG. 2.

The operation of the system of FIG. 2 will next be described with reference to the flow chart of FIG. 5 for detecting the center position of the reference mark.

The processing unit 100 controls an object moving mechanism (not shown) to move the object 7 so that the center of any one of the reference marks 24 is brought to the zero position of the beam where the deflection signal to the deflector coil 6 is zero, which position is at a point 0 on the object 7 as shown in FIG. 2, hereinafter referred to as beam center.

Then, the processing unit 100 supplies a control signal via an interface circuit 33 to a signal change-over switch (MPX) 34 to set it to the A-position. Thereafter, the processing unit 100 also supplies data of a deflection amount corresponding to the scanning start point $P_X$ of the electron beam 8 as shown in FIG. 4 via the switch 34 to a D/A converter 35. The D/A converter 35 converts it to an analog signal and supplies the current corresponding to the deflecting amount via a deflection amplifier 36 to the deflector coil 6. As a result, the electron beam 8 is deflected to the scanning start point $P_X$ as shown in FIG. 4A. Then, the processing unit 100 supplies data for scanning to the end point $Q_X$ by the electron beam 8 as shown in FIG. 4A, to the D/A converter 35 via the interface circuit 33 and the change-over switch 34, in sequence. The D/A converter 35 supplies a deflection current via the deflection amplifier 36 to the deflector coil 6 so that the electron beam 8 scans from the scanning start point $P_X$ to the scanning end point $Q_X$ in a continuous way.

Meanwhile, the processing unit 100 receives the detected signal 26 of the reflected electrons 29 resulting from scanning the reference mark 24 by the electron beam 8, via the A/D converter 30 and the interface circuit 31. Similarly scanning in the Y-axis direction from $P_Y$ to $Q_Y$ is performed. The resulting mark detection signal is used to detect the peak of the reference mark, the center position of the mark being calculated.

The mark detection will now be described for making distortion correcting data.

(a) Measurement of the coordinates of the reference mark 24

First, let us correctly measure the distance between the reference marks 24 on the object 7 in FIG. 3. Since the distortion is negligibly small when the electron beam 8 is deflected by a small amount, the object 7 is moved to bring one of the reference marks 24 to the beam center. The above-described mark detection is performed at this beam center, so as to measure the difference between the mark and beam centers. Also, the adjacent reference mark 24 is moved to the beam center and the difference between the beam and mark centers is measured. At this time, the amount of movement of the object is measured by a high-precision instrument (for example, laser wavelength meter or the like). The amount of movement and the two measured differences between the beam and mark centers enable the determination of the distance between the two adjacent reference marks.

This operation is performed for all the reference marks 24 on the object, and the center of each reference mark 24 is converted to a position data with respect to the reference mark 24 at the center of the object 7 (at the electron beam center 27 in FIG. 3) as the origin. This position data is a correct position of each reference mark 24 and thus called the reference position of each reference mark.

(b) Measurement of the deflection position by reference mark

The center position of the reference mark 24 as the center of the object in FIG. 3 is moved to the beam center, and the respective center positions of the reference marks 24 are measured or determined through the above-described mark detection, only with the electron beam 8 being deflected.

The center position of each reference mark 24 determined by this measurement is the position detected by only deflecting the electron beam and includes a distortion. Moreover, the center position of each reference mark 24 is the position to which the beam is deflected from the beam center, and thus is called the deflection position of each reference mark.

Figure 6:
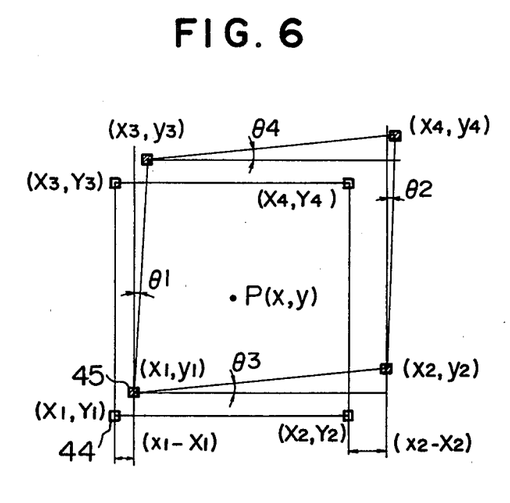
FIG. 6 shows the relation between the reference positions and deflected positions of the reference marks.

FIG. 6 shows the relation between the reference position and deflection position of four reference marks 24 in the region A of the reference mark group of FIG. 3. The difference between a reference position 44 and a deflection position 45 is an amount of deflection distortion at each reference mark due to the deflection of the electron beam 8.

In order to deflect the electron beam 8 from the deflection position 45 to the reference position 44 thereby correcting the distortion, it is necessary to correct the distortion of deflection at any point in the plane bounded by the four deflection positions 45 of the reference marks. Here, assuming that each distortion curve between the deflection positions is approximately linear, let correction data therebetween be formed by interpolation (primary interpolation). The case where the linear approximation is not allowed, will be described later. While only the plane region A in FIG. 3 will now be considered, the following description is applicable to the other regions of the plane.

The correction equation for the interest plane region will now be created for obtaining deflection correcting data.

In FIG. 6, the positions represented by large characters include data concerning the reference position 44, while those represented by small characters are deflection positions and arbitrary positions. For convenience, the suffixes 1 to 4 of the letters represent the reference marks 1 to 4, respectively. Moreover, the coordinates $(X_1, Y_1)$ to $(X_4, Y_4)$ represent the reference positions, and $(x_1, y_1)$ to $(x_4, y_4)$ the deflection positions. Now let the reference position $(X_1, Y_1)$ be the reference point in the plane region under consideration. Between the reference point $(X_1, Y_1)$ and the deflection position 45 there are differences of $(x_1 - X_1)$ in the direction X-axis and of $(y_1 - Y_1)$ in the Y-axis direction. These differences in the X- and Y-axis directions change with the increase of the amount of deflection.

First, let it be considered how the amount of distortion in the X-axis direction is changed with the change of the amount of deflection in the X-axis direction. Since the amount of deflection at $(X_1, Y_1)$ is $x_1 - X_1$ and that at $(X_2, Y_2)$ is $x_2 - X_2$, the amount of distortion $X_{D2}$ at $(X_2, Y_2)$ is expressed by $$X_{D2} = (x_1 - X_1) + \{(x_2 - X_2) - (x_1 - X_1)\} \quad (3)$$

$$= (x_1 - X_1) + \frac{\{(x_2 - X_2) - (x_1 - X_1)\}}{X_2 - X_1}(X_2 - X_1)$$

or $$X_{D2} = (x_1 - X_1) + \Delta X_x(X_2 - X_1)$$

$$\Delta X_x = \frac{(x_2 - X_2) - (x_1 - X_1)}{(X_2 - X_1)}$$

where $\Delta X_x$ is the rate of change of the X-axis deflection distortion from $X_1$ to $X_2$ per unit length. Thus, the distortion amount $X_{Dx}$ at a given point $(x, Y_1)$ between $X_1$ and $X_2$ (the deflection in the Y-axis direction is constant) is given by $$X_{Dx} = X_{x1} + (x - X_1)\Delta X_x$$

$$X_{x1} = x_1 - X_1 \quad (4)$$

where $X_{x1}$ can be called the deflection distortion in the X-axis direction.

Now, let it be considered how the amount of distortion in the X-axis direction is changed with the change of the amount of deflection in the Y-axis direction. Since the amount of deflection at $(X_1, Y_1)$ is zero, and that at $(X_3, Y_3)$ is $(x_3 - x_1)$, the amount of change $X_{D3}$ of the X-axis deflection distortion upon deflection in the Y-direction is expressed by $$X_{D3} = \frac{(x_3 - x_1)}{(y_3 - y_1)}(y_3 - y_1)$$

$$= \tan \theta_1 \cdot (y_3 - y_1)$$

$$= \Delta X_{y1} \cdot (y_3 - y_1)$$

Moreover, since the amount of deflection distortion is much smaller than the distance between the reference marks 24, $$X_{D3} = \Delta X_{y1} \cdot (Y_3 - Y_1) \cdot \Delta X_{y1} = \tan \theta_1 \quad (5)$$

$$= \frac{X_3 - X_1}{Y_3 - Y_1}$$

The amount of change $X_{D4}$ from $(X_2, Y_2)$ to $(X_4, Y_4)$ is given by $$X_{D4} \approx \Delta X_{y2} \cdot (Y_4 - Y_2)$$

$$\Delta X_{y2} = \tan \theta_2 = \frac{X_4 - X_2}{Y_4 - Y_2}$$

where $\Delta X_{y1}$ and $\Delta X_{y2}$ can be referred to as the distortion factors of deflection in the X-axis direction per unit length in the Y-axis direction.

In the plane region under consideration, let us consider the amount of change of deflection distortion in the X-axis direction upon deflection in the Y-axis direction. When the amount of deflection in the X-axis direction is changed from $X_1$ to $X_2$, the amount of deflection distortion in the X-axis direction is changed from $\Delta X_{y1}$ to $\Delta X_{y2}$ and thus the rate of change thereof $\Delta X_y$ is expressed by $$\Delta X_y = \frac{\Delta X_{y1} - \Delta X_{y2}}{X_2 - X_1} \qquad (6)$$

Therefore, the amount of the deflection distortion $X_{Dx}$ at a given point P (x, y) in the plane region under consideration is given by $$X_{Dx} = X_{x1} + (x - X_1)\cdot\Delta X_x + (y - Y_1)\cdot\{\Delta X_{y1} + (x - X_1)\cdot\Delta X_y\} \qquad (7)$$

from the equations (3) to (6).

Similarly, the amount of deflection distortion $Y_{Dy}$ in the Y-axis direction is expressed by $$Y_{Dy} = Y_{y1} + (y - Y_1)\cdot\Delta Y_y + (x - X_1)\cdot\{\Delta Y_{x1} + (y - Y_1)\cdot\Delta Y_x\} \qquad (8)$$

where $$Y_{y1} = (y_1 - Y_1)$$

$$\Delta Y_y = \frac{(y_3 - Y_3) - (y_1 - Y_1)}{(Y_3 - Y_1)}$$

$$\Delta Y_{x1} = \frac{y_2 - y_1}{(X_2 - X_1)} = \frac{y_2 - y_1}{X_2 - X_1}$$

$$\Delta Y_x = \frac{\tan\theta_3 - \tan\theta_4}{Y_3 - Y_1}$$

$$\tan\theta_3 \approx \frac{y_2 - y_1}{(X_2 - X_1)}$$

$$\tan\theta_4 \approx \frac{y_4 - y_3}{(X_4 - X_3)}$$

Thus, subtraction of the equations (7) and (8) from the deflection signal will permit the electron beam to be deflected to a proper position.

Since the $(x - X_1)$ and $(y - Y_1)$ in the equations (7) and (8) equal the deflection values from the reference position $(X_1, Y_1)$ in the plane under consideration, the correction signals $X_{Cx}$ and $Y_{Cy}$ are expressed by $$-X_{Cx} = X_{x1} + (X)_{12\text{-}0}\cdot\Delta X_x + (Y)_{12\text{-}0}\cdot\{\Delta X_{y1} + (X)_{12\text{-}0}\cdot\Delta X_y\} \qquad (9)$$

$$-Y_{Cy} = Y_{y1} + (Y)_{12\text{-}0}\cdot\Delta Y_y + (X)_{12\text{-}0}\cdot\{\Delta Y_{x1} + (Y)_{12\text{-}0}\cdot\Delta Y_x\} \qquad (10)$$

where $(X)_{12\text{-}0}$ and $(Y)_{12\text{-}0}$ are lower data ($\Delta L$) of the deflection signal in the X- and Y-axis directions, respectively.

The upper three bits of the deflection signal represent a signal specifying the position of the plane region bounded by the four reference marks 24 in FIG. 3. If, for example, A=0 and B=0, the signal specifies the plane area (0, 0), and if A=3 and B=3, the plane area is at (3, 3).

The factors $X_{x1}$, $\Delta X_x$, $\Delta X_{y1}$, $\Delta X_y$, $Y_{y1}$, $\Delta Y_y$, $\Delta Y_{x1}$, and $\Delta Y_x$ are computed from data at the reference position 44 and deflection position 45 by the processing unit 100 and stored via an interface circuit 37 in the memory within a distortion correction circuit 38 as shown in FIG. 2.

In this way, the correction data is determined to correct for the deflection distortion of the electron beam deflected by the deflector coil 6 and stored in a memory of the distortion correction circuit 38.

The practical operation for pattern formation will now be described with reference to FIG. 2. The processing unit 100 supplies a control signal via the interface circuit 33 to the signal change-over switch 34 to set it to its B-side position. Thus, the switch 34 allows an output signal 43 from an adder circuit 39 to be applied to the D/A converter 35. The D/A converter 35 supplies a current according to the output signal 43 via the deflection amplifier 36 to the deflector coil 6 to thereby control the amount of deflection of the electron beam 8. To a pattern control circuit 41 is applied data of a pattern to be formed on the object 7, from the processing unit 100 via an interface circuit 40. When supplied with a pattern formation start command from the processing unit 100, the pattern control circuit 41 converts the pattern data to deflection signals 61 and 62. The deflection signals 61 and 62 from the pattern control circuit 41 are applied to the correction circuit 38 and the adder circuit 39. The correction circuit 38 receives the deflection signals 61 and 62 from the pattern control circuit 41 to read the correction data stored in the memory and produce a correction signal 66. The adder circuit 39 adds the deflection signals 61 and 62 from the pattern control circuit 41 and the correction signal 66 from the correction circuit 38 to produce a corrected deflection signal as an output signal 43.

Figure 7:
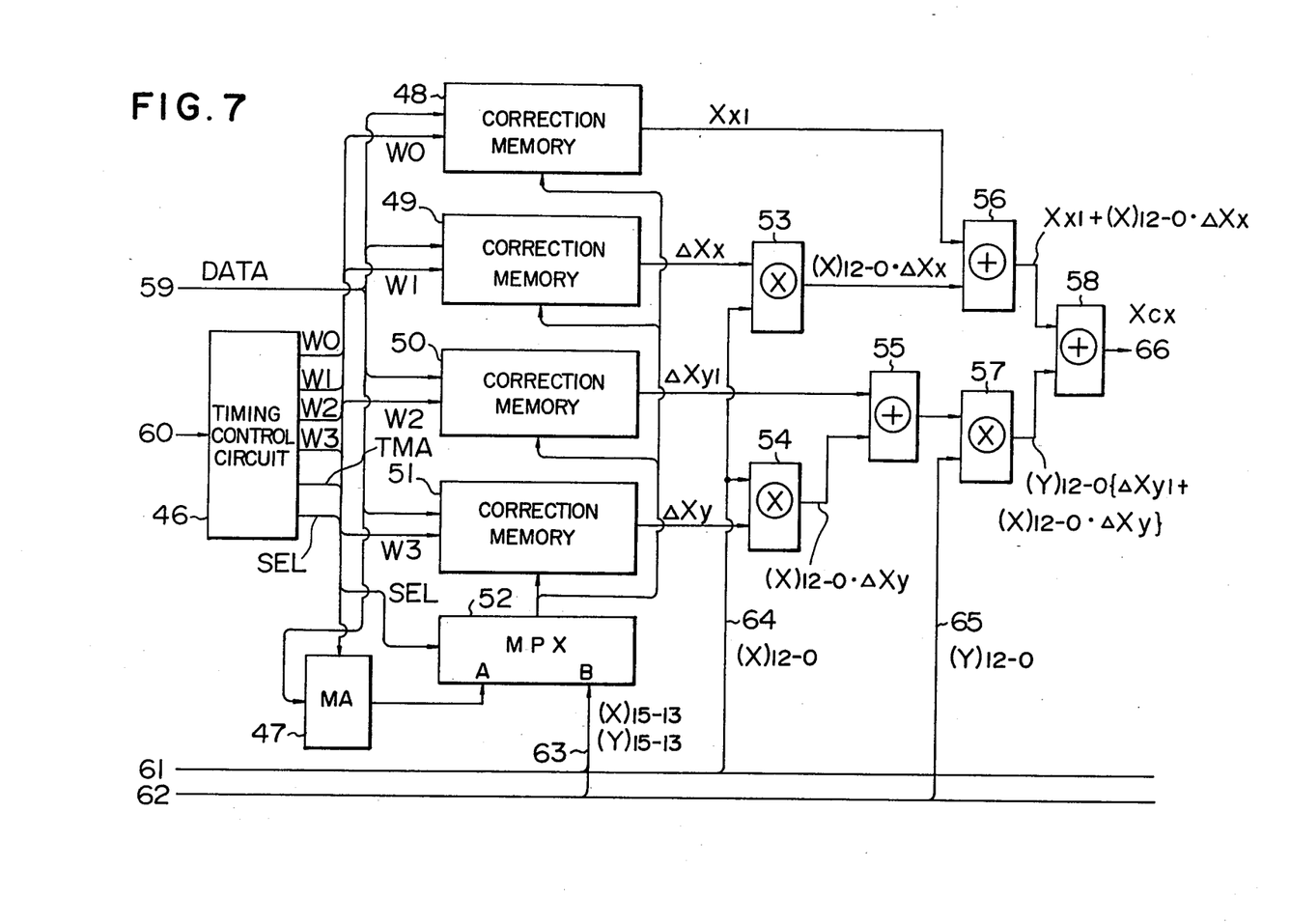
FIG. 7 is a detailed block diagram of the correction circuit in FIG. 2.
Figure 9:
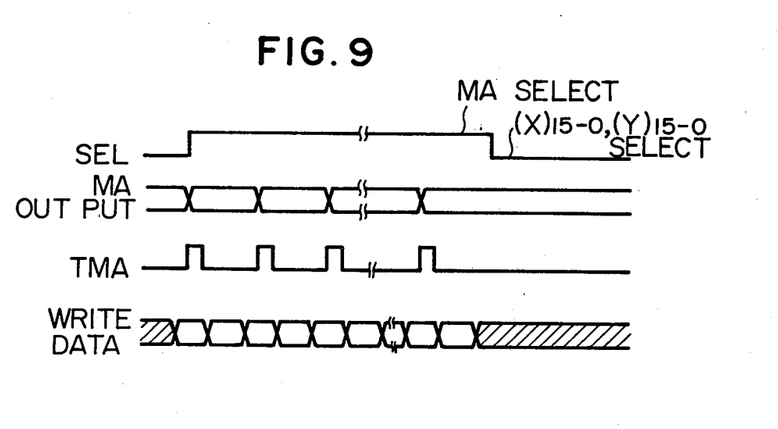
FIGS. 9 and 10 are timing charts for the correction memory.
Figure 10:
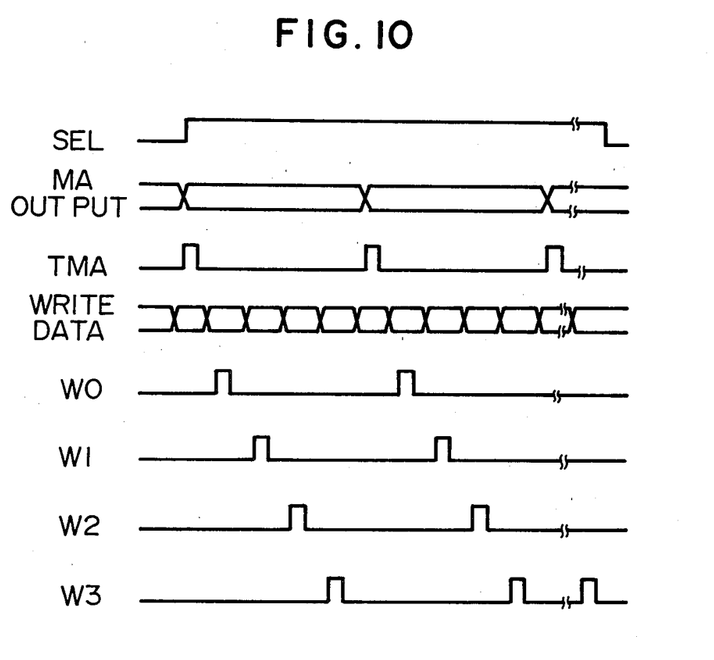

FIG. 7 is a detailed block diagram of the correction circuit 38 for X-axis deflection. The correction circuit for Y-axis deflection is similarly constructed. Referring to FIG. 7, there is shown a timing control circuit 46, which produces timing signals W0 to W3, TMA and SEL as shown in FIGS. 9 and 10, in response to the command from the processing unit 100 via the interface circuit 37. The signal W0 is applied to a correction memory 48, W1 to a correction memory 49, W2 to a correction memory 50, and W3 to a correction memory 51. The correction memories 48 to 51, when supplied with the timing signals W0 to W3, store the correction factors $X_{x1}$, $\Delta X_x$, $\Delta X_{y1}$ and $\Delta X_y$ of the equations (9) and (10) which are computed by the processing unit 100, via the interface circuit 37 along the data line. The timing signal TMA is supplied to a correction memory addressing counter (MA) 47 to renew its contents, and the timing signal SEL is used to switch the positions A and B of a signal change-over switch (MPX) 52.

Figure 11:
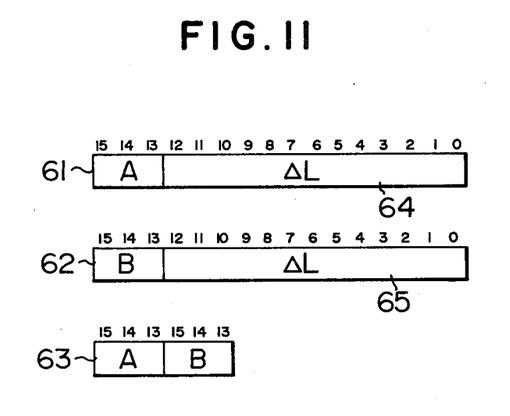
FIG. 11 shows the bit arrangement of the correction signal.

The addresses of the correction memories 48 to 51, when the switch 52 is changed to the A-position by the timing signal SEL, are supplied from the address counter 47. The address part equals to the upper bits (13th to 15th bits) of the deflection signal 61, 62 as shown in FIG. 11. Thus, the correction data for the deflection distortion computed by the processing unit 100 is stored at the address corresponding to each plane region as shown in FIG. 3. The writing of data for the deflection distortion computed by the processing unit 100 is stored at the address corresponding to each plane region as shown in FIG. 3. The writing of data in the correction memories 48 to 51 are performed simultaneously as shown in the flow chart of FIG. 8A or separately as shown in the flow chart of FIG. 8B.

Figure 8A:
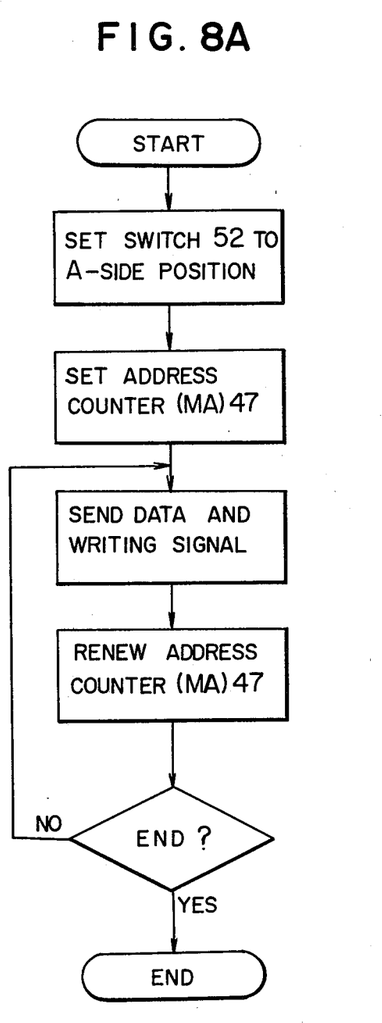
FIGS. 8A and 8B are flow charts useful for explaining the writing process in the correction memory in FIG. 7.

FIG. 9 shows a timing chart in the case of simultaneous writing as shown in the flow chart of FIG. 8A. As shown in FIG. 9, the timing signal TMA from the timing control circuit 46 also serves as the timing signals W0 to W3. Thus, when the timing signal SEL is applied to the switch 52 to thereby change it to the A-side position and while the switch is kept in the A-side position, the correction memories 48 to 51 store the correction data at the addresses specified by the address counter 47 each time the timing signal TMA is received. On the other hand, the address counter 47 responds to the timing signal TMA to renew the address in sequence.

Figure 8B:
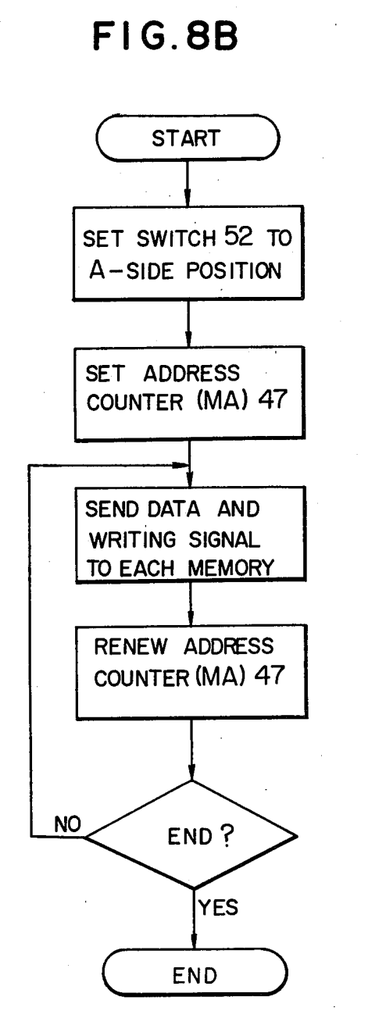

FIG. 10 shows a timing chart in the case of separate writing as shown in the flow chart of FIG. 8B. While the signal change-over switch 52 is changed to the A-side position and kept in the position by the timing signal SEL, data is written in the memories. The address counter 47, when supplied with the timing signal TMA, specifies the addresses of the correction memories 48 to 51. The correction memories 48 to 51 store the correction data at their specified addresses each time the timing signals W0 to W3 are applied thereto.

After the correction data computed by the processing unit 100 has all been written in each correction memory in the above way, the actual pattern formation is started.

In the actual pattern formation, the timing signal SEL changes the position of the switch 52 to the A-side. Thus, the pattern control circuit 41 as shown in FIG. 2 produces the X-axis deflection signal 61 and Y-axis deflection signal 62. The upper three bits (13th to 15th bits) of each of the signals 61 and 62, as shown in FIG. 11, constitute the address signal 63. This address signal 63 equals that for the correction memory 48. The address signal 63 is applied via the switch 52 to the correction memories 48 to 51 at a time which allows the contents at this address to be read from the memories 48 to 51. On the other hand, the lower 13 bits (0 to 12th bits) of each of the signals 61 and 62 constitute data showing the amount of deflection $\Delta L$, this data being applied to multipliers 53, 54 and 57 and adders 55, 56 and 58 which will be described later.

The output of the correction memory 49 is applied to the multiplier 53 where it is multiplied by the lower 13 bits of the X-axis deflection signal 61 to produce $(X)_{12\text{-}0} \cdot \Delta X_x$. Then, the adder 56 adds it to the output $X_{x1}$ from the memory 48 to produce $X_{x1} + (X)_{12\text{-}0} \cdot \Delta X_x$.

The output $\Delta X_y$ from the correction memory 51 is applied to the multiplier 54 where it is multiplied by $(X)_{12\text{-}0}$ to produce $(X)_{12\text{-}0} \cdot \Delta X_y$, which is added to the output $\Delta X_{y1}$ from the correction memory 50 by the adder 55, and then multiplied by the signal $(Y)_{12\text{-}0}$ at the multiplier 57, from which $(Y)_{12\text{-}0} \{\Delta X_{y1} + (X)_{12\text{-}0} \cdot \Delta X_y\}$ is produced. The outputs from the adder 56 and multiplier 57 are applied to the adder 58, which then produces correction data 66, or $X_{x1} + (X)_{12\text{-}0} \cdot \Delta X_x + (Y)_{12\text{-}0} \{\Delta X_{y1} + (X)_{12\text{-}0} \cdot \Delta X_y\}$, which coincides with the equation (9). This correction data 66 is applied to the adder 39 in FIG. 2 where the X-axis deflection signal 61 is corrected to appear as the actual deflection signal.

In this way, the deflection distortion correction can be performed by using the correction memories 48 to 51, multipliers 53, 54 and 57 and adders 55, 56 and 58.

While the number of the reference marks 24 is $(2^3+1)^2$ for the region of deflection signal in the above embodiment, the value of $\Delta L$ may be made short in distance where linear approximation is possible when the distortion curve between the reference marks 24 can not be approximated linearly. In this case, the number of the reference marks is naturally $(2^n+1)^2$.

While the multiplication and addition as shown in FIG. 7 are digital operations, data supplied to the multipliers and adders may be converted by a D/A converter to an analog signal for analog operation.

Thus, this invention can provide an electron beam patterning method and apparatus capable of properly correcting for the deflection distortion even though the physical performance or fabrication precision of the deflector system for the electron beam is somewhat poor.

What is claimed is:

1. An apparatus for forming a predetermined pattern on an object through controlled deflection of an electron beam while correcting the deflection distortion of the electron beam, said apparatus comprising:

deflector means for deflecting an electron beam;

an object provided with a plurality of reference marks formed thereon for correcting a deflection distortion associated with said deflector means;

a processing unit which is operative before pattern formation to measure the positions of the reference marks on said object by scanning the reference marks with the electron beam to determine deflection distortion correction data through interpolation on the basis of the measured results and which provides pattern forming data; and a control unit which preliminarily stores said correction data and is operative upon pattern formation to correct said pattern forming data supplied from said processing unit by use of the stored correction data, thereby supplying the corrected data as a deflection signal to said deflector means, including A/D converter means for converting information obtained by scanning said reference marks with said electron beam into digital signals and for supplying said digital signals to said processing unit, a signal change-over switch responsive to a control signal from said processing unit, D/A converter means for D/A converting the output of said switch to produce a deflection signal to be supplied to said deflector means, correction means for producing a correction signal for actual pattern formation on the basis of said correction data from said processing unit, pattern control means for producing a deflection signal to be supplied to said deflector means on the basis of said pattern forming data from said processing unit, and adder means for adding said correction signal from said correction means and said deflection signal from said pattern control means to produce a corrected deflection signal, said signal change-over switch being responsive to said control signal to select the output from said adder means upon pattern formation and the output data from said processing unit upon correction of deflection distortion.

2. An apparatus according to claim 1, wherein said correction means includes means for determining an X-axis deflection signal $X_{Cx}$ and a Y-axis deflection signal $Y_{Cy}$ from the equations $$X_{Cx} = X_{x1} + (X) \cdot \Delta X_x + (Y) \cdot \{\Delta X_{y1} + (X) \cdot X_y\}$$

and $$-Y_{Cy} = Y_{y1} + (Y) \cdot \Delta Y_y + (X) \cdot \{\Delta Y_{x1} + (Y) \cdot Y_x\}$$

where (X) and (Y) are amounts of deflection commanded to reference positions in the X-axis and Y-axis directions respectively, $X_{x1}$ and $Y_{y1}$ are factors showing the amounts of deflection in the X-axis and Y-axis directions with respect to respective reference positions, $\Delta X_x$ and $\Delta Y_y$ are factors showing rates of change of deflection distortion per unit length upon deflection in the X-axis direction alone and Y-axis direction alone respectively, $\Delta X_{y1}$ and $\Delta Y_{x1}$ are factors of deflection distortion produced in the X-axis and Y-axis directions per unit length upon deflection in the Y-axis and X-axis directions respectively, and $\Delta X_y$ and $\Delta Y_x$ are factors showing rates of change of deflection distortion in the X-axis and Y-axis directions upon deflection in the Y-axis and X-axis directions respectively, the respective factors showing the correction data determined by said processing unit, (X) and (Y) showing the deflection signals from said pattern control means.

3. An apparatus according to claim 2, wherein said correction circuit includes first memory means for storing the factor $X_{x1}$ (or $Y_{y1}$), second memory means for storing the factor $\Delta X_x$ (or $\Delta Y_y$), third memory means for storing the factor $\Delta X_{y1}$ (or $\Delta X_{x1}$), fourth memory means for storing the factor $\Delta X_y$ (or $\Delta Y_x$), address counter means for specifying the addresses of said first to fourth memory means, first multiplier means for multiplying the contents of said second memory means and the deflection signal (X) {or (Y)}, second multiplier means for multiplying the contents of said fourth memory means and the deflection signal (X) {or (Y)}, first adder means for adding the contents of said third memory means and the output from said second multiplier means, second adder means for adding the contents of said first memory means and the output of said first multiplier means, third multiplier means for multiplying the output of said first adder means and the deflection signal (Y) {or (X)}, and third adder means for adding the output of said second adder means and the output of said third multiplier means.

4. An apparatus according to claim 3, wherein said first to third multiplier means and said first to third adder means perform digital operations.

5. An apparatus according to claim 3, wherein said first to third multiplier means and said first to third adder means perform analog operations.

6. A method of forming a predetermined pattern on an object through controlled deflection of an electron beam while correcting the deflection distortion of the electron beam, said method comprising before pattern formation a first step of electron beam scanning an object prepared with reference marks formed thereon to measure the positions of said reference marks and a second step of determining deflection distortion correction data through interpolation from the measured results, said method comprising upon pattern formation a third step of correcting pattern forming data with said correction data to produce a deflection signal for deflecting the electron beam and a fourth step of deflecting the electron beam in accordance with said deflection signal to form the predetermined pattern; wherein said first step includes a first phase of bringing the center of the reference mark to a position where the deflection distortion of electron beam is zero, a second phase of scanning the reference mark at least in the X-axis and Y-axis directions with the electron beam thereby to determine the center position of the reference mark, and a third phase of determining the coordinates of the reference mark to obtain the difference between the reference position and a deflected position of electron beam due to deflection distortion, thereby determining said correction data by interpolation.

* * * * *